US006660988B2

(12) United States Patent
Lee et al.

(10) Patent No.: US 6,660,988 B2
(45) Date of Patent: Dec. 9, 2003

(54) DETECTOR SELECTIVE FPA ARCHITECTURE FOR ULTRA-HIGH FPA OPERABILITY AND FABRICATION METHOD

(75) Inventors: Donald Lester Lee, Thousand Oaks, CA (US); Haluk Omer Sankur, Ventura, CA (US); William Victor McLevige, Newbury Park, CA (US)

(73) Assignee: Innovative Technology Licensing, LLC, Thousand Oaks, CA (US)

( * ) Notice: Subject to any disclaimer, the term of this patent is extended or adjusted under 35 U.S.C. 154(b) by 217 days.

(21) Appl. No.: 09/846,726

(22) Filed: May 1, 2001

(65) Prior Publication Data

US 2002/0162943 A1 Nov. 7, 2002

(51) Int. Cl.$^{7}$ .................................................. H01J 40/14
(52) U.S. Cl. ..................................... 250/208.1; 250/216
(58) Field of Search ........................... 250/208.1, 208.2, 250/216, 239

(56) References Cited

U.S. PATENT DOCUMENTS 5,293,036 A * 3/1994 Norton .................... 250/208.1

OTHER PUBLICATIONS

J.M. Arias, et al., *Planar p–on–n HqCdTe heterostructure photovoltaic detectors,* Appl. Phys.Lett.62 (9), Mar. 1, 1993, pp. 976–978.

M.E. Motamedi, et al., *FPAs and Thin Film Binary Optic Microplens Integration*, Jan. 1996, Society of Photo–Optical Instrumentation Engineers, SPIE vol. 2687 pp. 171–177.

H. Sankur, et al., *Fabrication of Refractive Microlens Arrays*, Feb. 1995, Society of Photo–Optical Instrumentation Engineers, SPIE vol. 2383, pp. 179–183.

H. Sankur, et al., *Fabrication of Microlens Arrays by Reactive ion Milling*, Feb. 1996, Society of Photo–Optical Instrumentation Engineers, SPIE vol. 2687 pp. 150–155.

J.P. Rosbeck, et al., *Background and Temperature Dependent Current–Voltage Characteristics of HgCdT–Photodiodes*, J.Appl.Phys. 53 (g), Sep. 1982, American Instituted of Physics, pp. 6430–6439.

J.P. Rode, et al., *HgCdTe Infrared Focal Arrays for Imaging Spectometer Applications*, SPIE—The International Society for Optical Engineering, 1983, pp. 48–54. NASA–sponsored research.

Masaharu Deguchi, et al., *Microlens Design Using Simulation Program For CCD Image Sensor*, IEEE Transactions on Consujmer Electronics, vol. 38, No. 3, Aug. 1992, pp. 584–589.

* cited by examiner

*Primary Examiner*—Hung Xuan Dang
(74) *Attorney, Agent, or Firm*—Koppel, Jacobs, Patrick & Heybl

(57) ABSTRACT

A focal plane array has a plurality of detectors for each pixel of the array. The detector having the best operability for each pixel is determined and a custom microlens array is fabricated, with each lens having a focal point directed to the best detector on each pixel. A Multiplexer (MUX) similarly transmits signals from the selected detectors while blocking transmission from the non-selected detectors.

18 Claims, 4 Drawing Sheets

504
506
502
500
MUX 512
504
506
500
502
MUX 510
510
508
504
506
500
502
MUX 514
506
500
502
MUX 504
506
500
502
MUX

DETECTOR SELECTIVE FPA ARCHITECTURE FOR ULTRA-HIGH FPA OPERABILITY AND FABRICATION METHOD

BACKGROUND OF THE INVENTION

1. Field of the Invention

This invention relates to optoelectronic detector arrays and more specifically to Focal Plane Arrays (FPAs).

2. Description of the Related Art

A photodetector registers photon flux striking it as a function of time. An array of a large number of photodetectors can simultaneously register the photon fluxes from many spatial points (called pixels) to form an electronic version of an optical image. In such arrays, some detectors will often be inoperable due to randomly located material defects such as structural dislocations and processing defects that cause electrical shorts or unacceptably high tunneling currents, resulting in poor image uniformity.

Smaller photodetectors reduce the impact of defects which are due to structural dislocations, since the detectors cover a smaller area of the material layer and have a reduced chance of being located in a defective region. However, smaller detectors also have a decreased optical collection efficiency. Focal Plane Arrays (FPAs) use microlenses which concentrate incident radiation into a detector region, thereby permitting smaller area detectors without significant loss of optical collection efficiency. (see Motamedi, et. al., FPA's and Thin Film Binary Optic Microlens Integration, Miniaturized Systems with Micro-Optics and Micromechanics, Volume 2687, January 1996, page 70). Using this technique, optical collection efficiency or operability in the 90–98% range has been achieved for strategic Very long wavelength Infrared (VLWIR) FPAs operating at 40° K. Still, for many applications including hyperspectral imaging using VLWIR FPAs, clusters of bad pixels are deemed unacceptable because either spatial or spectral information in a critical band may be lost. Due to the high random nature of the defects, achieving low or zero cluster outages requires an extremely high operability, generally 99% or greater, which is presently not achieved even with the use of microlens arrays.

SUMMARY OF THE INVENTION

The present invention is an FPA array, and method for fabricating an FPA array, having a plurality of detectors per pixel, wherein radiation is directed to the best detector of each pixel.

According to a preferred method, the FPA has a microlens array which is custom designed to focus and direct radiation to the most operative detector in each pixel. Each detector is connected to a separate and selectable input of a multiplexer (MUX). Since FPAs are generally tested before the fabrication of the microlens array, the operability of each detector can be evaluated, and a file generated specifying detector operability for each pixel. According to one embodiment, this file is used to generate a custom gray-scale microlens mask for fabricating the array using photolithography, in which the shape of the lens for each pixel is chosen to direct the lens focus spot to the best detector in each pixel. The better detector is similarly selected for readout by the MUX while the other detectors are not selected.

This reduces the impact of both material and fabrication defects, since detectors which are defective for any reason can be screened out. Thus, for an array having two detectors per pixel, if the probability of any one detector being defective is 2–10%, the probability of both detectors per pixel being defective is approximately 0.04–1%.

These and other features and advantages of the invention will be apparent to those skilled in the art from the following detailed description, taken together with the accompanying drawings, in which:

DETAILED DESCRIPTION OF THE INVENTION

Figure 1:
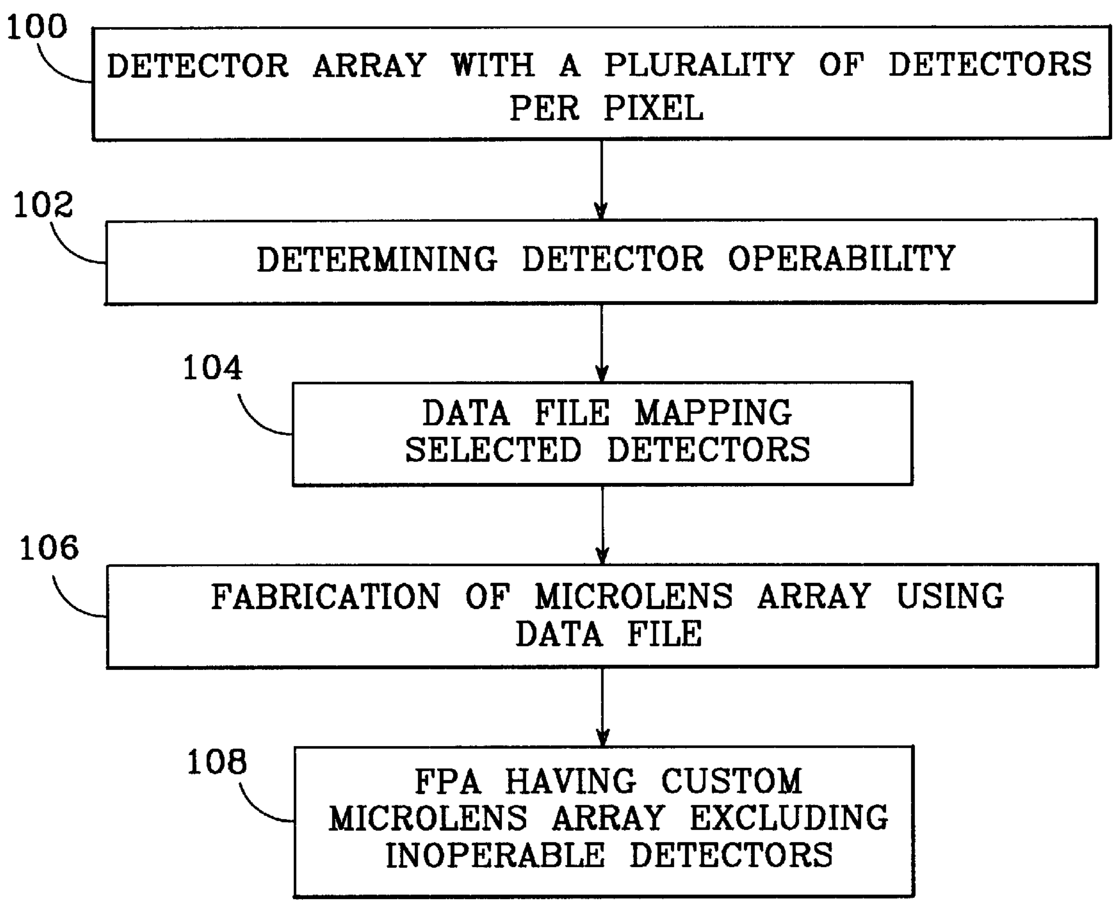
FIG. 1 is a flow diagram showing a method for fabricating an FPA according to the present invention.

FIG. 1 illustrates a method for fabricating an FPA according to the present invention. This procedure includes: 1) fabricating a detector array having a plurality of detectors per pixel (step 100); 2) testing each detector to determine its operability (step 102); 3)creating a data file which maps out a selected detector for each pixel, primarily based on operability (step 104); and 4) using the data file to create a custom microlens array designed to direct radiation to the selected detector in each pixel of the detector array(step 106). The result is an FPA with a custom microlens array which excludes inoperable detectors (step 108).

There are many types of FPAs for detecting electromagnetic radiation of varying wavelengths. This invention is applicable to virtually any type of FPA, and is most useful for very long wavelength Infrared (VLWIR) detecting FPAs, as materials often used for these, such as Mercury Cadmium Telluride (HgCdTe), have a particularly high number of defects which result in low operability and poor image uniformity.

A typical FPA array has a surface layer array of microlens elements for receiving and focusing electromagnetic radiation; and a detector array beneath the microlens array comprising a substrate and a photosensitive layer beneath the substrate having an array of detector elements (typically diodes) embedded in the layer. Each detector element has an interconnect metal, typically Indium, for establishing electrical contact to an external multiplexer (MUX) unit. The MUX also known as a Read Out Integrated Circuit (ROIC), has an array of mating bumps, typically also Indium, corresponding to the interconnect bumps on the detector array. Corresponding contact bumps on the MUX and detector array are fused (by cold welding in the case of Indium-Indium bumps) to form a hybrid unit. (Some versions of detector-MUX arrays, such as silicon detector-readouts used in CCD cameras, are commercially sold as monolithic units).

Each addressable elementary unit of the FPA is defined as a pixel. Conventional FPAs have one photodetector per pixel, and a corresponding microlens element per pixel which focuses radiation into the detector of each pixel. The present invention provides for a plurality of detectors per pixel, and a corresponding microlens element per pixel with a modifiable focus point for directing radiation into a selected detector in each pixel. After initial manufacture, the best detector is determined and the microlens element is caused to direct the radiation onto that pixel.

The detector array can be fabricated using standard photomasking techniques to map out the desired detector pattern. (For an example see J. M. Arias, et al., "Planar p-on-n HgCdTe heterostructure photovoltaic detectors", Appl. Phys. Lett. 62(9), Mar. 1, 1993, pages 976–978).

The selection of a detector for each pixel is based primarily upon its ability to function properly. A properly functioning detector will have a high quantum efficiency, low dark current levels, and low noise levels. The best detector may be selected based primarily on these factors. When there are multiple detectors which are sufficiently operative, as will usually be the case, the selection of the detector upon which the radiation will be directed can be arbitrary, or other factors such as position of the detector on the pixel, and/or the relative spacing between selected detectors for adjacent pixels, may be taken into account. In general, it is desirable for the selected detector to be located as close to the center of the pixel as possible, with a maximum distance from the selected detectors of adjacent pixels.

Figure 2:
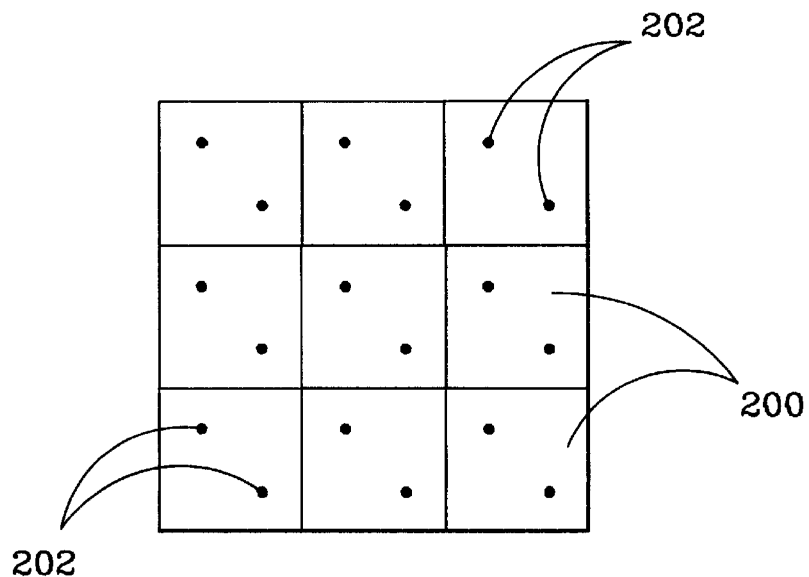
FIG. 2 is a sectional view of a pixel array in accordance with the invention

FIG. 2 illustrates an array of pixels 200 with two detectors 202 (indicated by dots) per pixel in accordance with the invention. (A simplistically small number of pixels is shown for clarity of illustration). A square array is shown, but other regular tiling patterns of substantially polygonal cells can also be used. Although theoretically the detectors can be located anywhere on the pixel, it is generally desirable to locate the detectors relatively close to the center but relatively far from each other. In the illustrated case of two detectors per square pixel, the detectors are preferably located along a diagonal and equidistant from the center of the pixel. The selected distance of the detectors from the center involves a tradeoff between reducing the required lens focal point shift for close detectors, and reducing the probability of encountering a defect for longer distances, since defects tend to be grouped. Also, the complexity of MUX circuitry limits the relative proximity of adjacent detectors. For example, in a preferred embodiment of a 40×40 $\mu m^2$ pixel having two detectors, each approximately 10×10 $\mu m^2$ in size, the detectors are located approximately 20 $\mu$m apart, centered along a diagonal of the pixel. Arrays with larger pixels (e.g. 100×100 $\mu m^2$) may allow for one of the detectors to be located at the center.

While it is theoretically possible to have any number of detectors per pixel, this number is practically limited by the detector area relative to the available pixel space. For most applications the pixel size can range from approximately 15×15 to 100×100 $\mu m^2$ For VLWIR FPAs 40×40 $\mu m^2$ is common. The detectors generally range from about 7×7 to 30×30 $\mu m^2$, with interconnect bumps from 10×10 to 15×15 $\mu m^2$. Therefore, a typical VLWIR FPA will have about two to three detectors per pixel.

Following the fabrication of the detector array, but before fabrication of the microlens array, the detector array is fused to a MUX chip by means of an array of mating bumps which correspond to the contact bumps on the detector array.

For an array with Indium contact bumps, the MUX mating bumps are preferably also Indium. The corresponding arrays of Indium bumps are aligned with each other, using a microscope to ensure proper alignment, and the two units are pressed together to form a detector-MUX hybrid. The fusion of the In—In bumps by pressure is known as cold welding. (The detector and MUX can also be fabricated monolithically, eliminating the need to join two separate units).

After the detector-MUX hybrid has been formed, the detector array is illuminated with radiation, read out signals are collected from the MUX to determine the operability of each detector, and a data file is created which indicates detector operability. When the array is exposed to detectable radiation, the inoperable detectors will appear as either excessively high or low signals in the MUX output. In an array with photodiode detectors, diodes which are inoperable due to material defects will produce a signal having a distinctly high current, which is most accurately detected by blocking external radiation. Defective diodes may also yield low signals due to processing defects such as poor electrical interconnects.

According to a preferred method for fabricating the microlens array, the data file is used to generate a custom gray-scale microlens mask (discussed in more detail below) in which the shape of the lens for each pixel is chosen to direct the lens focal spot to the selected detector on each pixel.

The MUX circuitry is designed to allow for each detector signal to be either read and transmitted to an output, or blocked. Accordingly, after a detector has been selected for each pixel, the MUX is programmed to read out only from the selected detectors. Accordingly, only the selected detectors on each pixel produce information which is read out by the MUX, while the other detectors are ignored. Suitable MUX units can be supplied and custom made by companies such as Rockwell, Raytheon, and DRS Infrared Technology. (Additionally, while a MUX is preferred, other readout techniques could be used, such as obtaining parallel readouts from the selected detectors.)

A Preferred Procedure for Fabricating the Microlens Array

There are various possible embodiments for a microlens array in which each lens is designed to direct radiation to a selected detector on each pixel. According to a preferred embodiment, each pixel has a lens which substantially covers its entire area, with the borders between lenses following a regular polygonal pattern. When the selected detector is located at the center of the pixel, the lens preferably has a spherical contour, which is approximately symmetrical over the pixel area.

Figure 3:
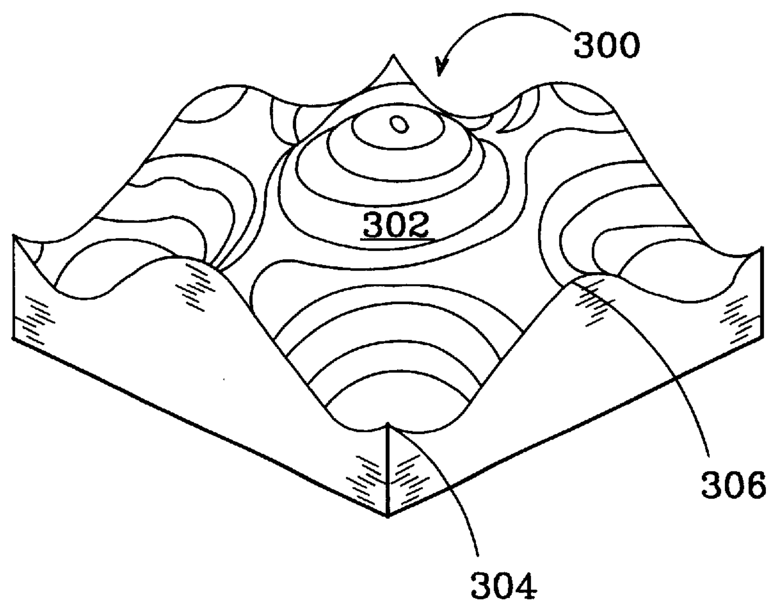
FIG. 3 is a perspective view of a microlens fabricated in accordance with a preferred embodiment, with topographic lines to illustrate surface contour.

The geometry of a symmetrical microlens having a spherical geometry, in accordance with the preferred method of fabrication, is shown in FIG. 3 as it would appear if cut apart from its neighboring microlenses in an array. The figure is based upon atomic force microscopic mapping of a typical microlens fabricated according to the preferred method. The microlens 300 has an approximately spherical surface 302 which substantially covers a polygonal cell (here shown as a square, for example only and not by way of limitation).

The surface of the microlens 300 approximates spherical (or other desired surface of revolution such as parabolic or elliptical) substantially across the entire area of its polygonal cell. This causes the surface 302 to appear to dip deeper at the corners, as at 304, while less dip is apparent at the side mid-points (as at 306). This of course is a necessary consequence of the fact that the diagonal is always longer than either side of a rectangle. Therefore, the diagonals traverse a longer distance than the sides, including more arc of the spherical surface 302.

When the selected detector is off-center, the point of focus is adjusted by shifting the lens so that its apex lies above that detector.

Figure 4:
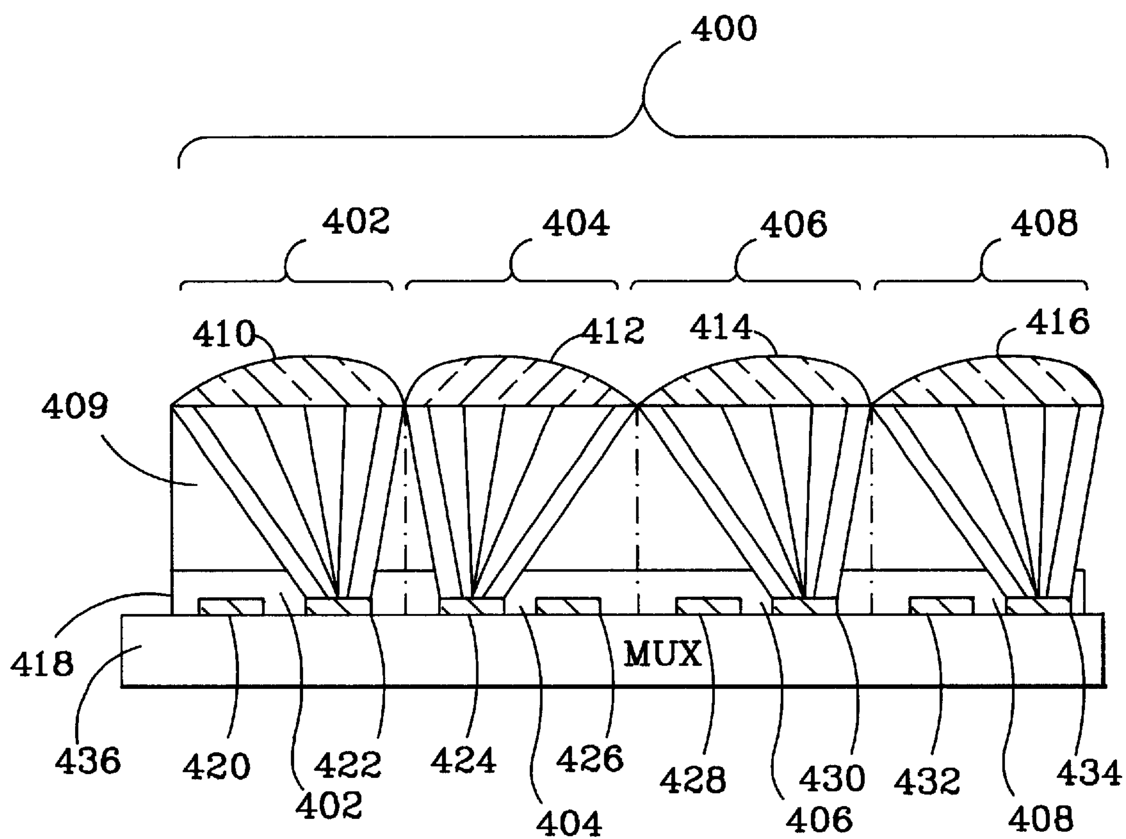
FIG. 4 is a sectional view of four rectangular pixels in an array having circularly symmetrical lenses shifted off-center.

FIG. 4 is a sectional view of a simplified model of an FPA 400 according to a preferred embodiment, having circularly symmetrical lenses shifted off center. (A simplistically small number of pixels is shown for clarity of illustration). The array 400 comprises four rectangular pixels 402, 404, 406, 408 formed on a substrate 409 a surface layer array of microlenses 410, 412, 414, 416, a photosensitive layer 418 beneath the substrate 409, and an array of detectors 420, 422, 424, 426, 428, 430, 432, 434 embedded in the layer, each being in electrical contact with mating bumps on a MUX unit 436. The lenses 410, 412, 414, 416 are shifted off center to focus radiation to the selected detectors 422, 424, 430, 434. (In an array having selected detectors located in the center, the lenses are not shifted).

Greater or lesser radii of curvature could be fabricated according to the desired focal lengths. According to a preferred embodiment, the focal length is between 1–2 times the pixel width. For a circular lens, the focal length is a function of the radius of curvature and refractive index (n) according to: $f=(nr)/(n-1)$. (See H. O. Sankur and M. E. Motamedi, "Microoptics Development in the past decade", The International Society for Optical Engineering, Vol. 4179, Sep. 20, 2000, pages 31, 32).

The microlens array is fabricated directly onto the substrate by gray-scale photolithography and ion milling. In the case of a detector-MUX hybrid, the space between the detector array and read out array is preferably back-filled with a nonconducting epoxy before fabrication of the microlens array, to hold the units in place and secure alignment.

The method for preparing the microlens array comprises the steps of: 1) starting with a detector array on a substrate, depositing a layer of photoresist on the substrate surface; 2) printing a thickness contour into the photoresist by gray-scale photolithography, using a high resolution gray-scale mask (the mask is prepared by writing with a high energy e-beam into High Energy Beam Sensitive glass (HEBS glass), and 3) transferring the thickness contours of the photoresist into the substrate by ion etching to produce an array of refractive lenses in the substrate in which each microlens in the array maintains its contour substantially across the entire surface, border to border.

Before starting the fabrication process, the substrate may have to be thinned down so that the fabricated lens will be at an appropriate distance from the detector array, corresponding to the focal distance. This can be done by lapping and polishing the substrate.

Figures 5A, 5B, 5C, 5D, 5E:
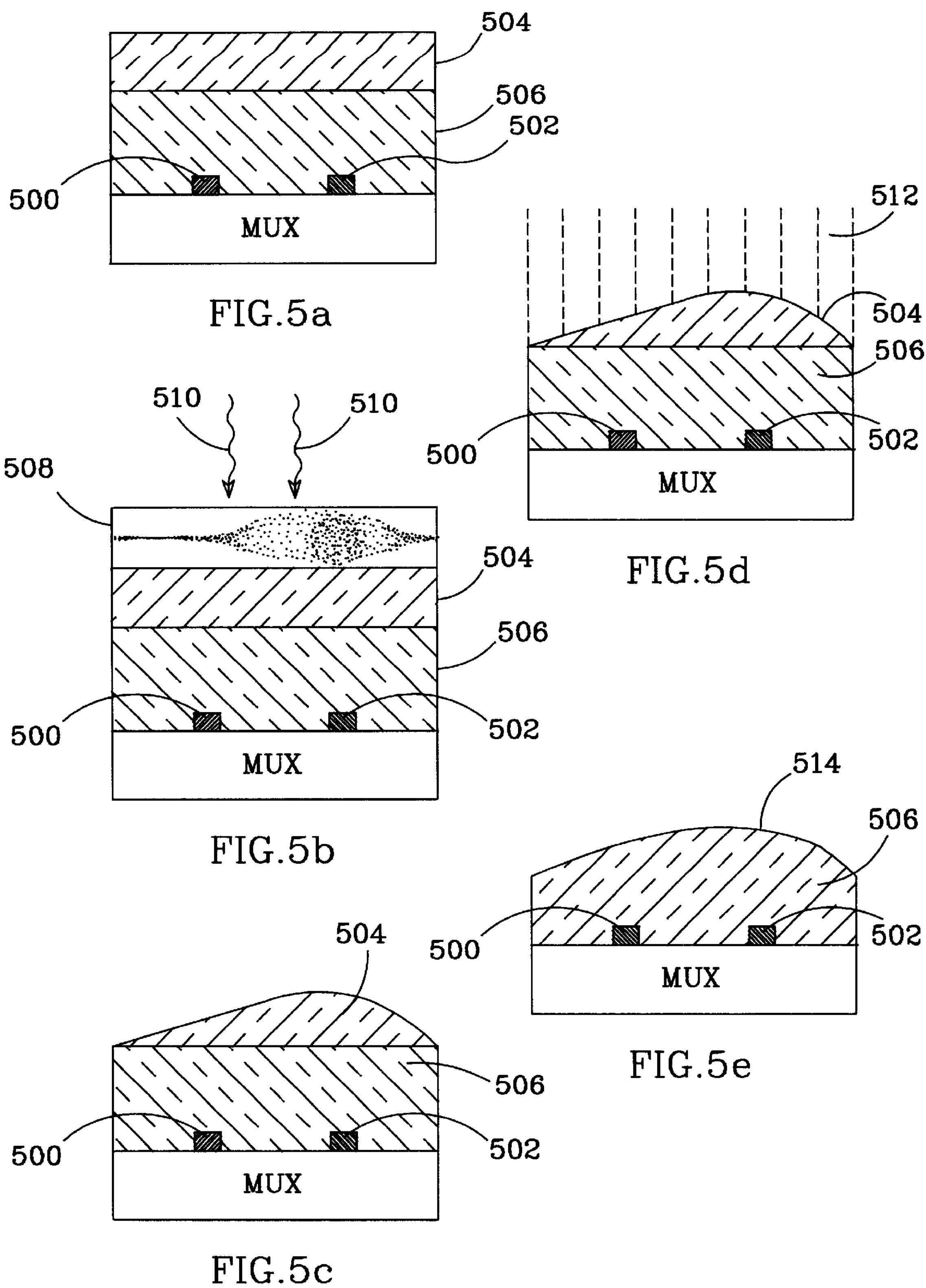
FIGS. 5*a–e* are sequential sectional views of a fabrication sequence in accordance with the preferred method for fabricating a microlens array.

The fabrication process for a pixel having off-center detectors 500, 502 is illustrated in FIGS. **5*a*–5*e*. Fabrication on only one pixel is shown for clarity of illustration. As shown in FIG. 5*a*, fabrication of the microlens array starts with the application of a conventional photoresist 504 to the surface of a substrate 506. The photoresist 504** is applied to an approximate thickness of 1–3 microns, suitably by spin-coating.

As shown in FIG. **5*b*, the gray scale patterned mask 508 is placed directly on the photoresist 504 and exposed to ultraviolet light 510. This step is similar to the more familiar photomasking steps in conventional IC processing, except that it employs gray scale rather than simple black/white masking. The mask 508, is fabricated with a gray-scale absorption profile, here represented by graduated stippling, according to a profile calculated to produce a desired microlens elevation contour. In FIG. 5*b*, the portion of the mask 508 over the selected detector has a peak absorption, which gradually diminishes away from the peak according to a spherical profile shifted off center. (for the purpose of illustration, it is assumed that detector 502 is selected). The degree of exposure of the photoresist 504 to the UV light is inverse to the absorption density of the immediately overlying mask. For this purpose a positive photoresist is used, whose development and ease of removal varies positively with its degree of exposure. For a negative photoresist, whose ease of removal varies inversely with its degree of exposure, the absorption profile of the mask 508** would be inverted.

After exposure, the exposed photoresist is removed in a developer solution. More accurately, the photoresist is removed to a greater or lesser degree according to the amount of light exposure it received in the preceding exposure step of FIG. **5*b*. The result, shown in FIG. 5*c*, is that the remaining photoresist 504 is formed into contoured islands of elevation varying in relation to the light exposure received in the previous step (FIG. 5*b*) Next, as illustrated in FIG. 5*d*, the remaining photoresist 504 is subjected to a milling technique such as reactive ion etching, symbolized by ions 512, which erodes the substrate 506 differentially, in inverse proportion to the thickness of the immediately overlying photoresist layer 504. This transfers the thickness contours of the photoresist (which is environmentally unstable) into the substrate 506. The contours can be suitably transferred, for example, by reactive ion etching in an $O_2$ and $SF_6$ ambient environment at approximately 20 milliTorr pressure at 20 degrees C. (see H. Sankur, et al., "Fabrication of microlens arrays by reactive ion milling", The International Society for Optical Engineering, Vol. 2687, January, 1996, pages 150–154; and H. Sankur, et al., "Fabrication of refractive microlens arrays", The International Society for Optical Engineering, Vol. 2383, February, 1995, pages 179–183). The result, after etching, is shown in FIG. 5*e*: the substrate 506 has been formed into a microlens 514** having the desired contour to focus the radiation of interest onto the selected detector.

It is also possible to fabricate the microlenses on a planarizing material, suitably made of an acrylic polymer material transparent to the radiation of interest, which can be applied to the substrate 506 by spin coating to a thickness of 1–2 microns and then heated to a temperature of 200 degrees C. for 30 minutes to planarize the material. Thereafter, the same steps for fabricating the array onto the substrate are taken, starting with application of the photoresist, except that the contours are ultimately transferred into the planarizing layer instead of the substrate. In this case, the planarizing layer jointly with the underlying substrate forms the microlens.

Figure 6:
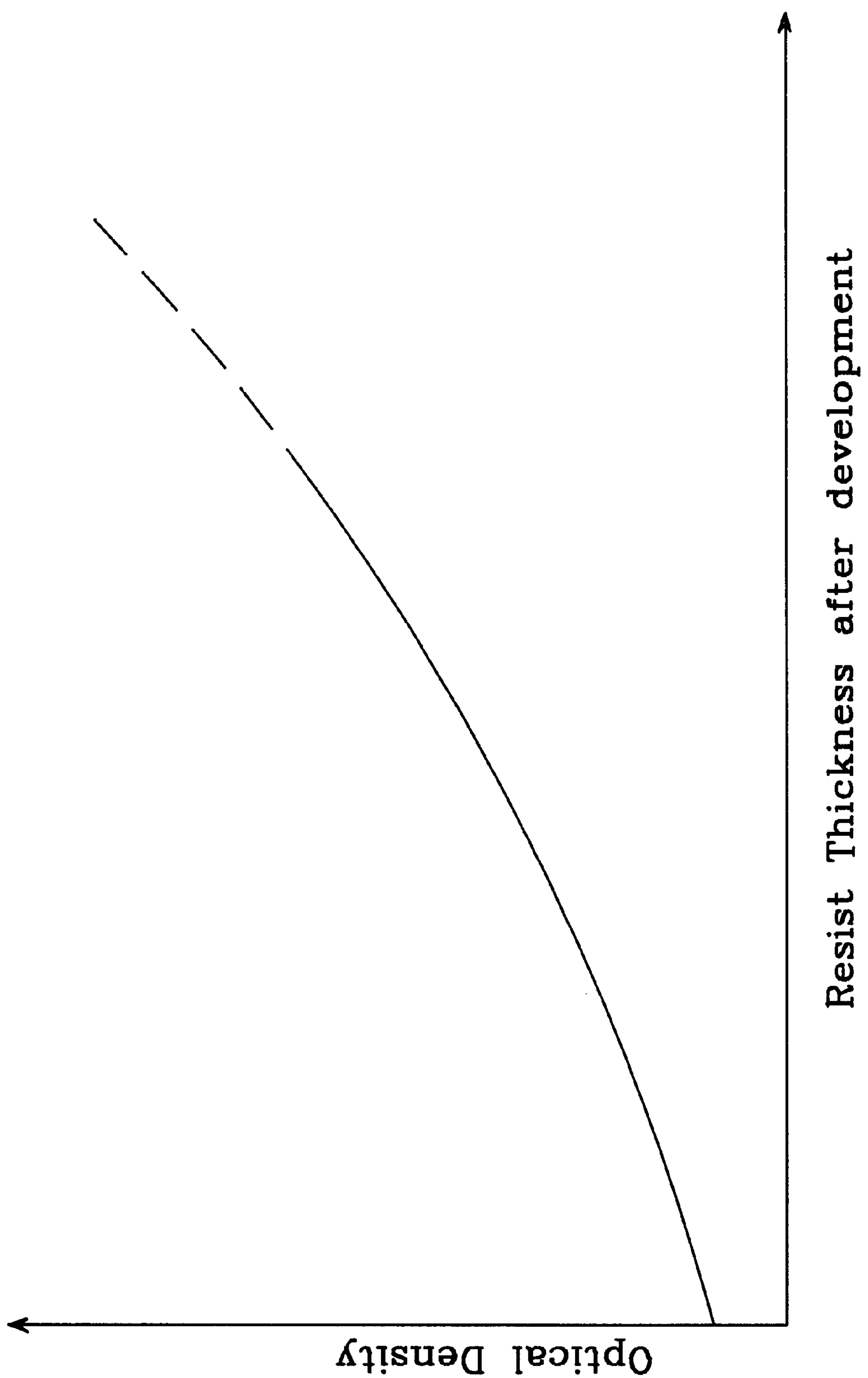
FIG. 6 is a plot of Optical Density versus thickness after development for a typical photoresist.

The method described requires a very finely modulated, gray-scale mask to differentially expose the photoresist according to the lens contour desired (in contrast to more conventional masking, which uses a simple black/white mask). Suitable gray-scale masks can be fabricated from high energy beam sensitive ("HEBS") glasses. Such glasses have optical density values which vary as a function of e-beam dosage, and can therefore be "written" or spatially modulated as desired by exposure to a modulated e-beam, for example in the 15–30 kV energy range. A gray level mask is thereby obtained with a continuous tone, even when observed at high levels of magnification. The optical density (OD) values obtained typically vary from 0.1 to 1.2 (on a logarithmic scale, where T is the transmission and $OD=\log_{10}1/T$). The response curve for the photoresist thickness after development versus the OD of the mask varies with the photoresist used, and can be experimentally obtained. FIG. 6 is a representative curve of OD versus thickness after development for a typical photoresist. The glass produces a very continuous gray scale because the coloring elements are specks of silver of approximately 10 nm dimensions. Thus the exposed glass has no discernible graininess and is capable of less than 0.25 micron resolution. HEBS glass photomask blanks are commercially available, for example from Canyon Materials, Inc. of San Diego, Calif. The technical details of how such HEBS glasses can be written, for example by a raster-scanning e-beam pattern generator, are given in the CMI (Canyon Materials, Inc.) Product Information Publications No. 96-01 (User's Manual) and 96-18.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A pixel for detecting electromagnetic radiation, comprising:

a plurality of radiation detectors; and a lens element, optically aligned with a selected one of said detectors arranged to direct incident radiation onto said selected detector.

2. The pixel of claim 1, wherein said lens element directs incident radiation away from each non-selected detector.

3. The pixel of claim 1, wherein each of said detectors is connected to a respective readout element, which is switchable between first and second states of operation, for transmitting a signal received from its corresponding detector to an output in the first state, and for blocking transmittal of the signal in the second state.

4. The pixel of claim 3, wherein each read out element connected to a non-selected detector is switched to operate in the second state, and the readout element connected to the selected detector is switched to operate in the first state.

5. The pixel of claim 1, said lens element having a polygonal border circumscribing a pair of opposed surfaces, one of said surfaces having a lens contour shape, and said detectors disposed at the other surface.

6. An FPA having an array of pixels, wherein each pixel comprises:

a plurality of radiation detectors; and a lens element, optically aligned with a selected one of said detectors arranged to direct incident radiation onto said selected detector.

7. The FPA of claim 6, wherein at least one detector is off-center within its respective pixel.

8. The FPA of claim 6, wherein all the detectors within each pixel are off-center.

9. The FPA of claim 6, wherein said lens element directs incident radiation away from each non-selected detector.

10. The FPA of claim 6, wherein each of said detectors is connected to a respective readout element, which is switchable between first and second states of operation, for transmitting a signal received from its corresponding detector to an output in the first state, and for blocking transmittal of the signal in the second state.

11. The FPA of claim 10, wherein each read out element connected to a non-selected detector is switched to operate in the second state, and the readout element connected to the selected detector is switched to operate in the first state.

12. The FPA of claim 6, said lens element having a polygonal border circumscribing a pair of opposed surfaces, one of said surfaces having a lens contour shape, and said detectors disposed at the other surface.

13. An FPA, comprising:

an array of radiation detectors;

an array of lenses, fewer then the number of detectors, optically aligned with respective detectors for directing radiation onto their respective detectors.

14. The FPA of claim 13, wherein at least some of said detectors are circumscribed by respective lenses but do not receive radiation from any of said lenses.

15. A method for operating a focal plane array (FPA) comprising:

providing an FPA with array of pixels having a plurality of detectors per pixel;

directing radiation incident on said pixels onto selected detectors of said pixels; and obtaining an output signal from the selected detectors to form an output image.

16. The method of claim 15, wherein the selected detectors are selected based upon their respective operabilities.

17. The method of claim 15, wherein incident radiation is directed onto only one detector for each pixel.

18. A radiation detector, comprising:

an array of pixels, each pixel including a plurality of mutually spaced radiation detectors; and a radiation director associated with said pixels and arranged to direct incident radiation onto only a single selected detector for each pixel.

* * * * *